US006961400B1

(12) United States Patent
Huff et al.

(10) Patent No.: US 6,961,400 B1

(45) Date of Patent: Nov. 1, 2005

(54) AUTOMATIC FREQUENCY CORRECTION APPARATUS AND METHOD OF OPERATION

(75) Inventors: William J. Huff, La Jolla, CA (US); Lawrence J. Malone, Carlsbad, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 670 days.

(21) Appl. No.: 09/935,940

(22) Filed: Aug. 23, 2001

(51) Int. Cl.[7] .................................................. H03L 7/18

(52) U.S. Cl. ...................................................... 375/376

(58) Field of Search ................................ 375/376, 296, 375/90; 329/300, 302; 332/107

(56) References Cited

U.S. PATENT DOCUMENTS 5,170,131 A * 12/1992 Takahiro et al. ............ 329/300
6,011,815 A * 1/2000 Eriksson et al. ............ 375/296
6,208,211 B1 3/2001 Zipper et al.
6,219,397 B1 4/2001 Park
6,236,703 B1 5/2001 Riley
6,249,238 B1 6/2001 Steinlechner

* cited by examiner

*Primary Examiner*—Stephen Chin
*Assistant Examiner*—Jaison Joseph

(57) ABSTRACT

A frequency shift keyed (FSK) receiver for demodulating an incoming transmitted signal comprising: 1) a phase-locked loop for receiving an oscillator reference signal having a frequency F1 and generating a reference carrier frequency signal having a desired frequency N1(F1), wherein N1 may be a non-integer value, the phase-locked loop comprising: a) a phase detector having a first input for receiving the oscillator reference signal and a second input; and b) a frequency divider circuit for dividing an actual frequency of the reference carrier frequency signal by an adjustable integer value N2 applied to a control input of the frequency divider circuit to generate a feedback signal applied to the second input of the phase detector. The FSK receiver further comprises: 2) a frequency discriminator that receives the incoming transmitted signal and the reference carrier frequency signal and generates a correction signal corresponding to a difference between a center frequency of the incoming transmitted signal and the actual frequency of the reference carrier frequency signal; and 3) a delta-sigma modulator controlled by the correction signal operable to generate a sequence of integers having an average value of N2 over a defined time period, wherein the sequence of integers are applied to the control input of the frequency divider circuit.

20 Claims, 3 Drawing Sheets

AUTOMATIC FREQUENCY CORRECTION APPARATUS AND METHOD OF OPERATION

TECHNICAL FIELD OF THE INVENTION

The present invention is directed, in general, to radio frequency (RF) receivers and, more specifically, to an automatic frequency correction apparatus using a delta-sigma frequency synthesizer and a frequency discriminator.

BACKGROUND OF THE INVENTION

The frequency spectrum of a digital radio system is broken into channels that are small sub-spectrums. A first transmitter and receiver pair establishes a communication link over a first predetermined channel while other transmitter and receiver pairs use other predetermined channels. The transmitter transmits to the receiver over the channel using a predetermined data rate and modulation scheme (i.e., BPSK, QPSK).

Typically, a data transmission consists of two parts. The first part is a preamble that is relatively easy for the receiver to detect and to synchronize with. The preamble may be, for example, a period of unmodulated carrier signal or a period of carrier signal modulated by a known training sequence using a simple modulation scheme. The second part of a data transmission is a modulated waveform that contains the unknown information data bits that are being transmitted.

The data rate of the transmission is usually measured in bits per second (bps), including kilobits per second (Kbps) and megabits per second (Mbps). The number of bits per second is related to the type of signaling (also known as encoding and modulation) that is used to convey the information and the number of times per second that the transmitted signal changes its value. For example, in a frequency-shift-keyed (FSK) digital signal radio system, data is encoded by generating frequency deviations away from the carrier frequency. Decoding the transmitted information entails measuring the frequency deviations away from the carrier frequency and inferring the transmitted information.

However, if the transmitted carrier frequency is at a frequency other than the nominal frequency the receiver expects, the measurement of frequency deviation becomes inaccurate. Thus, the performance and sensitivity of the receiver are degraded. This is a known problem in FSK digital radio systems. The above-described problem is depicted in greater detail in FIGS. 1A through 2B.

FIG. 1A illustrates a frequency-shift keyed (FSK) carrier signal that is properly aligned to a receiver reference carrier signal. The transmitted carrier frequency is shown as a solid line and the receiver carrier frequency is shown as a dotted line. When no data bits are being transmitted, the transmitter carrier signal is equal to some center frequency value, such as 600 MHz. The receiver carrier reference signal is aligned with the center frequency value. For the sake of clarity, the dotted line representing the receiver carrier frequency is slightly offset in FIG. 1 from the solid line representing the transmitted carrier frequency so that the two lines do not coincide.

When data bits are transmitted, the frequency of the transmitted carrier signal is varied above and below the nominal or center frequency. These frequency variations are represented by the up and down arrows in FIG. 1A. For example, a Logic 1 may be transmitted by changing the transmitter frequency to 100 KHz above the center frequency and a Logic 0 may be transmitted by changing the transmitter frequency to 100 KHz below the center frequency. Thus, in the exemplary embodiment, a Logic 1 would be transmitted as 600.1 MHz and a Logic 0 would be transmitted as 599.9 MHz.

Within the receiver, the frequency variations in the transmitted carrier signal are translated into amplitude variations in the output voltage of a frequency discriminator or a similar circuit. FIG. 1B illustrates the amplitude modulated output of a frequency discriminator receiving an FSK carrier signal that is properly aligned with a reference voltage representing the receiver reference carrier signal. The amplitude modulated output voltage of the frequency discriminator is shown as a solid line and the reference voltage representing the receiver carrier frequency is shown as a dotted line. For the sake of clarity, the dotted line representing the amplitude modulated output voltage is slightly offset in FIG. 1B from the solid line representing the reference voltage so that the two lines do not coincide.

The amplitude modulated output voltage of the frequency discriminator is compared to the reference voltage to determine the value of the transmitted data. When no data bits are being transmitted, the amplitude modulated output voltage is equal to the reference voltage. When a Logic 1 data bit is transmitted and the transmitter frequency increases to, for example, 100 KHz above the center frequency, the frequency discriminator increases the amplitude modulated output voltage above the reference voltage. When a Logic 0 data bit is transmitted and the transmitter frequency decreases to, for example, 100 KHz below the center frequency, the frequency discriminator decreases the amplitude modulated output voltage below the reference voltage. A voltage comparator circuit translates the voltage differences into Logic 1 values and Logic 0 values. In the example shown in FIGS. 1A and 1B, the data sequence 101100 has been transmitted.

FIG. 2A illustrates a frequency-shift keyed (FSK) carrier signal that is not properly aligned to the receiver reference carrier signal. The transmitted carrier frequency has drifted to a higher center frequency than in FIGS. 1A and 1B. The transmitted carrier frequency is shown as a solid line and the receiver carrier frequency is shown as a dotted line. The receiver carrier reference frequency is so far below the new transmitted carrier frequency that positive and negative frequency variations of the transmitted carrier signal above and below the new center frequency are both higher than the receiver carrier frequency. Thus, positive and negative frequency variations are both represented by up arrows in FIG. 2A.

FIG. 2B illustrates the amplitude modulated output of a frequency discriminator receiving an FSK carrier signal that is misaligned with a reference voltage representing the receiver reference carrier signal. The amplitude modulated output voltage of the frequency discriminator is shown as a solid line and the reference voltage representing the receiver carrier frequency is shown as a dotted line. As a result of the increase in the transmitted carrier frequency, the receiver reference voltage is so far below the amplitude modulated output voltage of the frequency discriminator that positive and negative amplitude variations in the amplitude modulated output voltage are both higher than the reference voltage. As a result, comparison of the amplitude modulated output voltage and the reference voltage translates the voltage differences into inaccurate Logic 1 and Logic 0 values. In the example shown in FIGS. 2A and 2B, the transmitted data sequence is inaccurately determined to be 111111.

Therefore, there is a need in the art for improved frequency shift keyed (FSK) receivers that are capable of more accurately adjusting for frequency drift in either the incoming transmitted carrier frequency or the receiver carrier reference signal.

SUMMARY OF THE INVENTION

The limitations inherent in the prior art described above are overcome by the present invention which provides an improved frequency shift keyed (FSK) receiver capable of demodulating an incoming transmitted signal. According to an advantageous embodiment of the present invention, the FSK receiver comprises: 1) a phase-locked loop for receiving an oscillator reference signal having a frequency F1 and generating a reference carrier frequency signal having a desired frequency N1 (F1), wherein N1 may be a non-integer value, the phase-locked loop comprising: a) a phase detector having a first input for receiving the oscillator reference signal and a second input; and b) a frequency divider circuit for dividing an actual frequency of the reference carrier frequency signal by an adjustable integer value N2 applied to a control input of the frequency divider circuit to thereby generate a feedback signal applied to the second input of the phase detector. The FSK receiver further comprises: 2) a frequency discriminator that receives the incoming transmitted signal and the reference carrier frequency signal and generates a correction signal corresponding to a difference between a center frequency of the incoming transmitted signal and the actual frequency of the reference carrier frequency signal; and 3) a delta-sigma modulator controlled by the correction signal operable to generate a sequence of integers having an average value of N1 over a defined time period, wherein the sequence of integers are applied to the control input of the frequency divider circuit.

According to one embodiment of the present invention, the FSK receiver further comprises a subtraction circuit capable of subtracting the correction signal from a nominal carrier frequency value to thereby generate a control frequency signal that controls the delta-sigma modulator.

According to another embodiment of the present invention, the frequency discriminator comprises a first mixer that receives the incoming transmitted signal and the reference carrier frequency signal and generates an intermediate frequency signal having a frequency equal to a difference between the center frequency of the incoming transmitted signal and the actual frequency of the reference carrier frequency signal.

According to still another embodiment of the present invention, the frequency discriminator further comprises a signal splitter that splits the intermediate frequency signal into a first child intermediate frequency signal and a second child intermediate frequency signal.

According to yet another embodiment of the present invention, the frequency discriminator further comprises a delay element that delays the second child intermediate frequency signal by a delay, T.

According to a further embodiment of the present invention, the delay, T, is a substantially equal to a quarter wavelength of the second child intermediate frequency signal.

According to a still further embodiment of the present invention, the frequency discriminator further comprises a second mixer that receives the first child intermediate frequency signal and the time-delayed second child intermediate frequency signal and generates a DC correction voltage.

According to a yet further embodiment of the present invention, the frequency discriminator further comprises an analog-to-digital converter that receives the DC correction voltage and outputs the correction signal.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION, it may be advantageous to set forth definitions of certain words and phrases used throughout this patent document: the terms “include” and “comprise,” as well as derivatives thereof, mean inclusion without limitation; the term “or,” is inclusive, meaning and/or; the phrases “associated with” and “associated therewith,” as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term “controller” means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1A:
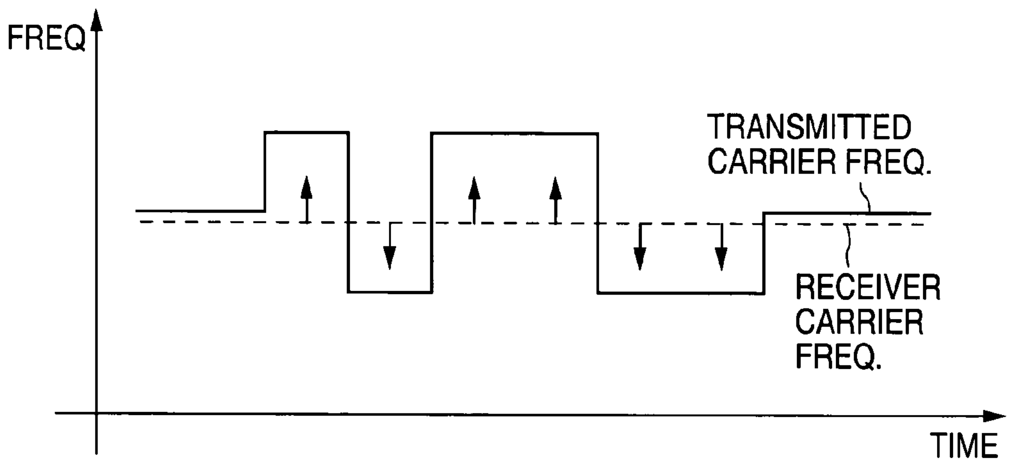
FIG. 1A illustrates a frequency-shift keyed (FSK) carrier signal that is properly aligned to a receiver reference carrier signal.
Figure 1B:
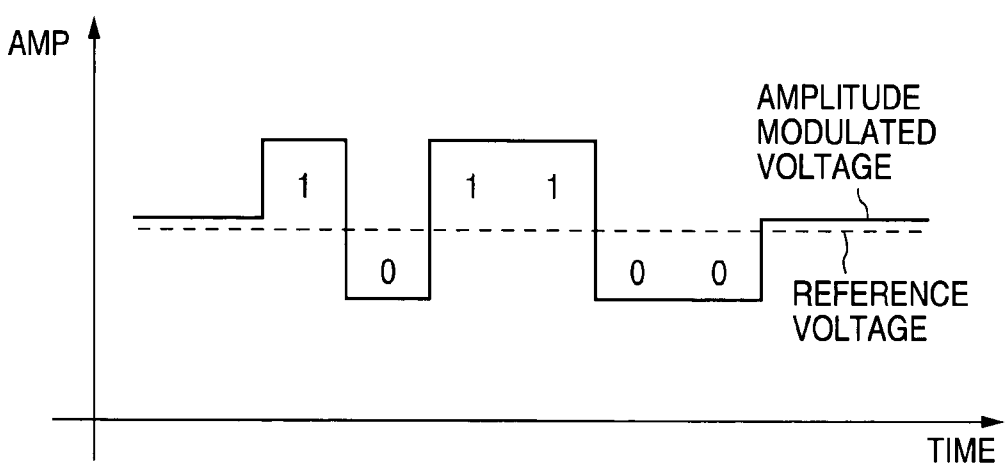
FIG. 1B illustrates the amplitude modulated output of a frequency discriminator receiving an FSK carrier signal that is properly aligned with a reference voltage representing the receiver reference carrier signal.
Figure 2A:
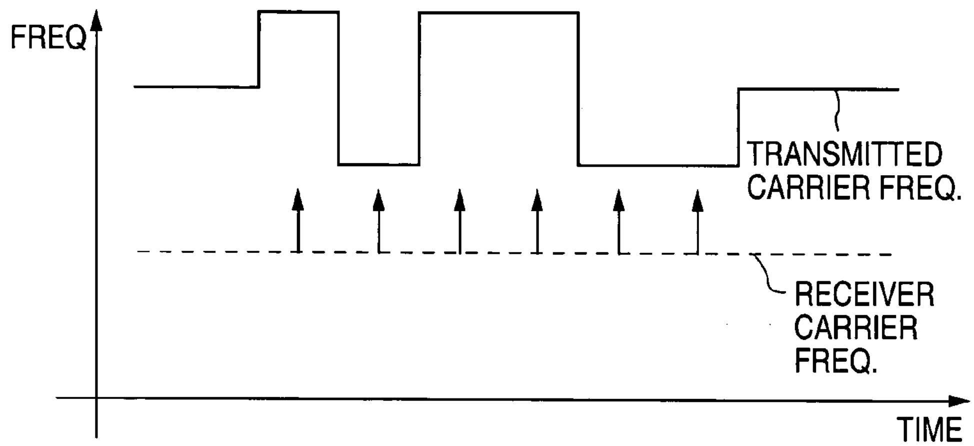
FIG. 2A illustrates a frequency-shift keyed (FSK) carrier signal that is not properly aligned to the receiver reference carrier signal.
Figure 2B:
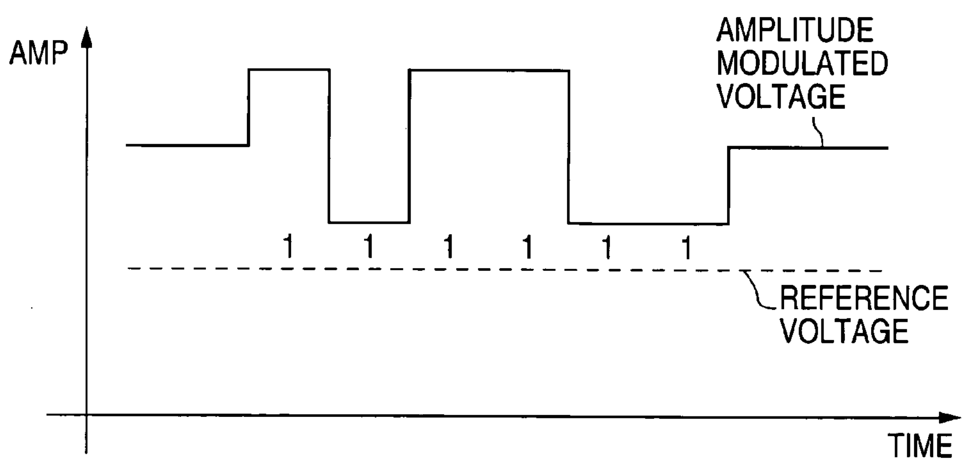
FIG. 2B illustrates the amplitude modulated output of a frequency discriminator receiving an FSK carrier signal that is misaligned with a reference voltage representing the receiver reference carrier signal.
Figure 3:
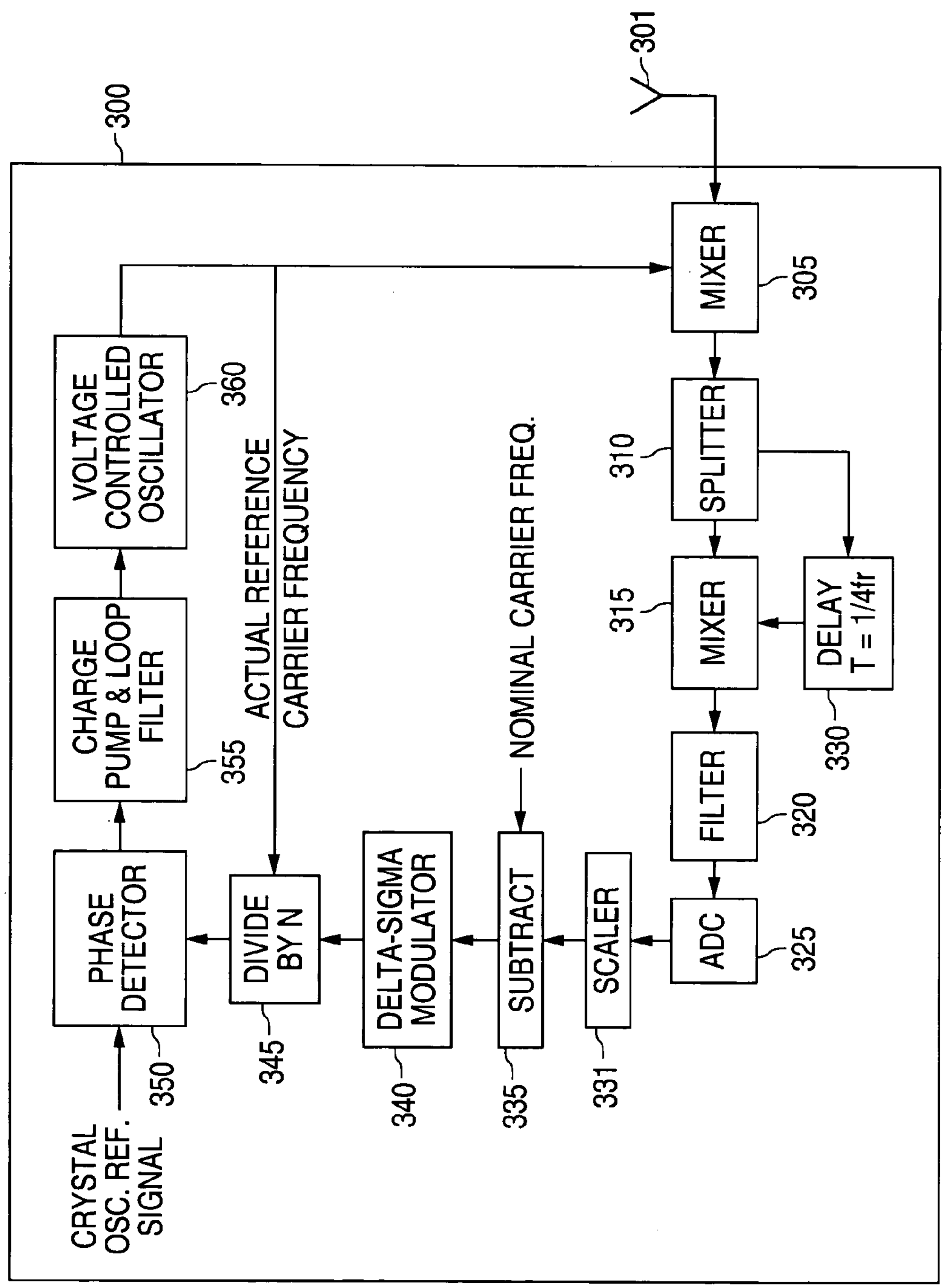
FIG. 3 is a block diagram of an exemplary frequency shift keyed (FSK) receiver according to one embodiment of the present invention.

FIGS. 1 through 3, discussed herein, and the various embodiments used to describe the principles of the present invention in this patent document are by way of illustration only and should not be construed in any way to limit the scope of the invention. Those skilled in the art will understand that the principles of the present invention may be implemented in any suitably arranged radio frequency (RF) receiver.

FIG. 3 is a block diagram of exemplary frequency shift keyed (FSK) receiver 300 according to one embodiment of the present invention. FSK receiver 300 comprises a fractional-N frequency synthesizer and a frequency discriminator. The frequency discriminator comprises mixer 305, splitter 310, mixer 315, and delay element 330. The fractional-N frequency synthesizer comprises a phase-locked loop (PLL) controlled by delta-sigma modulator 340. The PLL comprises divider circuit 345, phase detector 350, charge pump and loop filter unit 355, and voltage controlled oscillator (VCO) 360.

By using a fractional-N frequency synthesizer and a frequency discriminator, the present invention can accurately measure and quickly adjust the frequency offset in FSK receiver 300, thus improving the performance of FSK receiver 300 in the presence of a frequency offset. Negative control feedback is the underlying principle for the automatic frequency correction system provided by the present invention.

Mixer 305 is a down-conversion mixer that compares the relative frequencies of the incoming transmitted signal (received from antenna 301) and the actual reference carrier frequency produced by VCO 360 and generates an intermediate frequency signal that is a sinusoidal signal at the frequency difference between the transmitter and receiver carrier frequencies. For example, if the transmitted signal has a center frequency of 600 MHz, as measured during the unmodulated preamble, and the actual reference carrier frequency is 599 MHz, then the output of mixer 305 is a replica of the transmitted signal centered around an intermediate frequency of 1 MHz.

The 1 MHz intermediate frequency output signal of mixer 305 is split into two secondary (or child) intermediate frequency signals by splitter 310. A first 1 MHz child signal is delayed by a quarter wavelength (i.e., 90 degrees) by delay element 330. The inputs to mixer 315 are the delayed 1 MHz child signal and the undelayed 1 MHz child signal. In frequency discrimination, a signal multiplied in a mixer by a time-delayed copy of itself produces a DC voltage that varies with frequency deviation away from the carrier frequency. Filter 320 is a low-pass filter that removes the harmonic components produces by mixer 320. Thus, the difference between the actual reference carrier frequency in receiver 301 and the incoming transmitter carrier frequency is represented as a voltage level.

For simplicity, the signal into the frequency discriminator may be represented as:

$$\sin 2\pi ft,$$

where f is the difference in frequency between the transmitter and receiver carrier frequencies. After the quarter wavelength delay, T, the waveform at the output of delay element 330 is:

$$\sin 2\pi f(t+T).$$

Multiplying the signals together (in mixer 315), gives the term $$\sin 2\pi ft*\sin 2\pi f(t+T)$$

in the output of mixer 315. Through a trigonometric expansion, this term equals:

$$½[\cos 2\pi fT+\cos 2\pi fT(\cos 4\pi ft)+\sin 2\pi fT(\sin 4\pi fT)].$$

Filter 320 filters out the high frequency terms leaving:

$$½ \cos 2\pi fT.$$

Since f is the difference between the receiver nominal intermediate frequency, $f_r$, and the actual intermediate frequency, $f_t$, corresponding to the frequency of the transmitted signal, substitution yields:

$$½ \cos 2\pi(f_r-f_t)T.$$

with T=¼ of $f_r$. This yields the term:

$$½ \cos (\pi/2+\pi f_t/(2f_r)),$$

which equals 0 when $f_t=f_r$.

When the transmitted signal $f_t$ shifts higher in frequency than $f_r$, the frequency discriminator puts out a positive dc voltage that increases with the shift. When the input signal shifts lower in frequency than $f_r$, the frequency discriminator puts out a negative dc voltage that increases with shift.

Analog-to-digital (ADC) 325 converts the analog voltage level from filter 320 into a digital value. This digital value may be scaled (i.e., multiplied) by some factor by scaler 331 to match the range of the nominal carrier frequency (i.e., 599 MHz) that is internally generated in receiver 301. Subtraction circuit 335 subtracts the scaled output of scaler 331 from the value of the nominal carrier frequency to produce an error signal that controls the output of digital delta-sigma modulator 340.

A fractional-N PLL-based frequency synthesizer is capable of finer frequency resolution and faster settling times than an integer-N PLL frequency synthesizer. A fractional-N delta-sigma frequency synthesizer is a subclass of fractional-N frequency synthesizers. Fractional-N delta-sigma frequency synthesizers use digital delta-sigma modulation to achieve improved phase noise and spurious performance relative to standard fractional-N synthesizers. Since the signals are digital, additional settling time enhancements can be attained by using digital filtering to compensate for PLL dynamics.

Phase detector 350 detects the phase difference between the output of divider circuit 345 and a crystal oscillator reference signal and generates a pulse train in which the pulse-width varies according to the magnitude of the phase difference. For example, the crystal oscillator reference signal may be a 10 MHz signal and the divider circuit 345 may divide the 599 MHz actual reference carrier frequency produced by VCO 360 by a value of N=59.9 to produce a 10 MHz output. If the two 10 MHz signals are exactly in phase, the pulses produced by phase detector 350 have a predetermined width. The pulses are converted to a smooth DC VCO control voltage by charge pump and loop filter 355. The VCO control voltage controls the frequency of the output of VCO 360, namely the actual reference carrier frequency (or the local oscillator voltage).

If the 10 MHz frequency of the output of divider circuit 345 begins to lag the 10 MHz crystal oscillator (i.e., actual reference carrier frequency is too low), the pulses produced by phase detector 350 increase in width. The wider pulses are converted to a larger VCO control voltage by charge pump and loop filter 355. The larger VCO control voltage increases the frequency of the output of VCO 360, which increases the frequency of the output of divider circuit 345. Similarly, if the 10 MHz frequency of the output of divider circuit 345 begins to lead the 10 MHz crystal oscillator (i.e., actual reference carrier frequency is too high), the pulses produced by phase detector 350 decrease in width. The narrower pulses are converted to a smaller VCO control voltage by charge pump and loop filter 355. The smaller VCO control voltage decreases the frequency of the output of VCO 360, which decreases the frequency of the output of divider circuit 345.

The output of delta-sigma modulator 340 is a sequence of integers whose average value over time may be a fractional (i.e., non-integer) value. The integer value at the output of digital delta-sigma modulator 340 is the divisor, N, that divider 345 uses. Since the average value of the output of delta-sigma modulator 340 over time may be fractional, the division performed by divider circuit 345 may have an average divisor value that is fractional, even though at any instant in time the divisor, N, used by divider circuit 345 is an integer.

For example, if the actual reference carrier frequency is 599 MHz and it is desired that N 59.9 over time, then the output of delta-sigma modulator 340 may randomly output the integers 58, 59, 60 and 61. The output of delta-sigma modulator 340 will most often be 60, followed in frequency by 59. The integers 58 and 61 would occur much more infrequently. The sudden changes in the value of N produced by delta-sigma modulator 340 cause similar changes in the frequency of the output of divider circuit 345. However, these frequency fluctuations are damped out by charge pump and loop filter 355 so that VCO 360 produces a 599 MHz output under quiescent conditions.

If the center frequency of the incoming transmitted signal increases or decreases in value, this produces a corresponding increase or decrease in the DC voltage produced by filter 320. This is converted to a digital correction signal (positive or negative in value) that is subtracted from the 599 MHz nominal carrier frequency value to produce a new input control value to delta-sigma modulator 340. This in turns adjusts the average value of the value of the divisor, N, produced by delta-sigma modulator 340. The change in the value of N causes a corresponding change in the actual reference carrier frequency that tracks the change that occurred originally in the center frequency of the incoming transmitted signal.

The present invention improves the correction time for systems with closely spaced channels. While this system is not necessarily limited to delta-sigma frequency synthesizers, a delta-sigma frequency synthesizer increases the fidelity of the receiver reference carrier compared to that of both a standard fractional-N synthesizer and an integer-N synthesizer. In addition, the present invention improves the correction time for systems with closely spaced channels with respect to an integer-N synthesizer. A long correction time decreases the amount of time to send data and thus is undesirable. The present invention also requires reduced complexity. Attaining similar precision and speed of correction would require either a direct digital synthesizer or a direct analog synthesizer. In either of these traditional approaches, there is a significant increase in design and implementation complexity.

Although the present invention has been described in detail, those skilled in the art should understand that they can make various changes, substitutions and alterations herein without departing from the spirit and scope of the invention in its broadest form.

What is claimed is:

1. A frequency shift keyed (FSK) receiver capable of demodulating an incoming transmitted signal comprising:

a phase-locked loop for receiving an oscillator reference signal having a reference frequency and generating a reference carrier frequency signal having a desired frequency, said phase-locked loop comprising:

a phase detector having a first input for receiving said oscillator reference signal and a second input; and a frequency divider circuit for dividing an actual frequency of said reference carrier frequency signal by an adjustable integer value applied to a control input of said frequency divider circuit to thereby generate a feedback signal applied to said second input of said phase detector;

a frequency discriminator that receives said incoming transmitted signal and said reference carrier frequency signal and generates a correction signal corresponding to a difference between a center frequency of said incoming transmitted signal and said actual frequency of said reference carrier frequency signal; and a delta-sigma modulator controlled by said correction signal operable to generate a sequence of integers having an average value over a defined time period, wherein said sequence of integers are applied to said control input of said frequency divider circuit.

2. The FSK receiver as set forth in claim 1 further comprising a subtraction circuit capable of subtracting said correction signal from a nominal carrier frequency value to thereby generate a control frequency signal that controls said delta-sigma modulator.

3. The FSK receiver as set forth in claim 1 wherein the frequency discriminator comprises a first mixer that receives said incoming transmitted signal and said reference carrier frequency signal and generates an intermediate frequency signal having a frequency equal to a difference between said center frequency of said incoming transmitted signal and said actual frequency of said reference carrier frequency signal.

4. The FSK receiver as set forth in claim 3 wherein the frequency discriminator further comprises a signal splitter that splits said intermediate frequency signal into a first child intermediate frequency signal and a second child intermediate frequency signal.

5. The FSK receiver as set forth in claim 4 wherein the frequency discriminator further comprises a delay element that delays said second child intermediate frequency signal.

6. The FSK receiver as set forth in claim 5 wherein said delay is substantially equal to a quarter wavelength of said second child intermediate frequency signal.

7. The FSK receiver as set forth in claim 5 wherein the frequency discriminator further comprises a second mixer that receives said first child intermediate frequency signal and said time-delayed second child intermediate frequency signal and generates a direct current ("DC") correction voltage.

8. The FSK receiver as set forth in claim 7 wherein said frequency discriminator further comprises an analog-to-digital converter that receives said DC correction voltage and outputs said correction signal.

9. A method of demodulating a transmitted signal comprising the steps of:

mixing the transmitted signal and a reference carrier frequency signal having a desired frequency produced by a phase-locked loop (PLL) to generate a correction signal corresponding to a difference between a center frequency of the transmitted signal and an actual frequency of the reference carrier frequency signal;

in the phase-locked loop (PLL), dividing the actual frequency of the reference carrier frequency signal by an adjustable integer value applied to a control input of a frequency divider circuit to generate a PLL feedback signal;

in the phase-locked loop, comparing a phase of an oscillator reference signal having a reference frequency and a phase of the PLL feedback signal and using a phase difference to control a voltage controlled oscillator generating the reference carrier frequency signal having the desired frequency; and using a delta-sigma modulator controlled by the correction signal to generate a sequence of integers having an average value over a defined time period, wherein the sequence of integers are applied to the control input of the frequency divider circuit.

10. The method as set forth in claim 9 further comprising the step of subtracting the correction signal from a nominal carrier frequency value to thereby generate a control frequency signal that controls the delta-sigma modulator.

11. The FSK receiver of claim 1, wherein:

the reference frequency has a frequency of F1;

the average value has a value of N1;

the desired frequency has a frequency of N1*F1; and the adjustable integer value has a value of N2.

12. The FSK receiver of claim 11, wherein N1 represents a non-integer value.

13. The method of claim 9, wherein mixing the transmitted signal and the reference carrier frequency signal comprises:

generating an intermediate frequency signal having a frequency equal to a difference between the center frequency of the transmitted signal and the actual frequency of the reference carrier frequency signal.

14. The method of claim 13, wherein mixing the transmitted signal and the reference carrier frequency signal further comprises:

splitting the intermediate frequency signal into a first child intermediate frequency signal and a second child intermediate frequency signal.

15. The method of claim 14, wherein mixing the transmitted signal and the reference carrier frequency signal further comprises:

delaying the second child intermediate frequency signal.

16. The method of claim 15, wherein mixing the transmitted signal and the reference carrier frequency signal further comprises:

mixing the first child intermediate frequency signal and the time-delayed second child intermediate frequency signal to generate a direct current ("DC") correction voltage.

17. The method of claim 16, wherein mixing the transmitted signal and the reference carrier frequency signal further comprises:

converting the DC correction voltage into a digital value; and outputting the digital value as the correction signal.

18. An apparatus, comprising:

an antenna capable of receiving an incoming transmitted signal; and a receiver capable of demodulating the incoming transmitted signal, the receiver comprising:

a phase-locked loop capable of receiving an oscillator reference signal and generating a reference carrier frequency signal, the phase-locked loop comprising:

a phase detector having a first input and a second input, the first input capable of receiving the oscillator reference signal; and a frequency divider capable of dividing an actual frequency of the reference carrier frequency signal based on a control signal applied to a control input of the frequency divider to generate a feedback signal applied to the second input of the phase detector;

a frequency discriminator capable of receiving the incoming transmitted signal and the reference carrier frequency signal and generating a correction signal corresponding to a difference between a center frequency of the incoming transmitted signal and the actual frequency of the reference carrier frequency signal; and a delta-sigma modulator controlled by the correction signal and capable of generating the control signal applied to the control input of the frequency divider.

19. The apparatus of claim 18, wherein the frequency discriminator comprises:

a first mixer capable of receiving the incoming transmitted signal and the reference carrier frequency signal and generating an intermediate frequency signal having a frequency equal to the difference between the center frequency of the incoming transmitted signal and the actual frequency of the reference carrier frequency signal;

a signal splitter capable of splitting the intermediate frequency signal into a first child intermediate frequency signal and a second child intermediate frequency signal;

a delay element capable of delaying the second child intermediate frequency signal;

a second mixer capable of receiving the first child intermediate frequency signal and the time-delayed second child intermediate frequency signal and generating a direct current ("DC") correction voltage; and an analog-to-digital converter capable of receiving the DC correction voltage and outputting the correction signal.

20. The apparatus of claim 19, wherein the delay element is capable of delaying the second child intermediate frequency signal for a delay period that is substantially equal to a quarter wavelength of the second child intermediate frequency signal.

* * * * *